United States Patent
Adachi et al.

(10) Patent No.: US 6,990,155 B2
(45) Date of Patent: Jan. 24, 2006

(54) WIRELESS QUADRATURE MODULATOR TRANSMITTER USING E/O AND O/E CONNECTIVES

(75) Inventors: Hisashi Adachi, Minoo (JP); Masanori Iida, Katano (JP); Hiroyuki Asakura, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 744 days.

(21) Appl. No.: 09/867,910

(22) Filed: May 30, 2001

(65) Prior Publication Data
US 2001/0050962 A1 Dec. 13, 2001

(30) Foreign Application Priority Data
May 30, 2000 (JP) .............................. 2000-160551

(51) Int. Cl.
H04L 27/36 (2006.01)
H04L 23/02 (2006.01)
H04L 5/12 (2006.01)

(52) U.S. Cl. ...................... 375/298; 375/264; 375/261; 375/295; 398/183

(58) Field of Classification Search ................ 375/298, 375/302, 300, 295, 264; 455/91
See application file for complete search history.

(56) References Cited

U.S. PATENT DOCUMENTS

| | | | | |
|---|---|---|---|---|
| 4,775,851 A | * | 10/1988 | Borth | ......................... 341/155 |
| 5,061,928 A | * | 10/1991 | Karema et al. | ............. 341/143 |
| 5,534,827 A | * | 7/1996 | Yamaji | ....................... 332/103 |
| 5,629,701 A | * | 5/1997 | Ritoniemi et al. | .......... 341/143 |
| 5,682,161 A | * | 10/1997 | Ribner et al. | ................ 341/143 |
| 5,714,916 A | | 2/1998 | Yamaji | |
| 6,002,301 A | * | 12/1999 | Sugimura et al. | ........... 330/277 |
| 6,194,963 B1 | * | 2/2001 | Camp et al. | ................. 330/149 |
| 6,339,621 B1 | * | 1/2002 | Cojocaru et al. | ........... 375/247 |
| 6,504,636 B1 | * | 1/2003 | Seto et al. | .................... 398/91 |

FOREIGN PATENT DOCUMENTS

| | | |
|---|---|---|
| EP | 0 426 560 A | 5/1991 |
| JP | 06-164427 A | 9/1994 |
| WO | WO 98/11683 A | 3/1998 |

OTHER PUBLICATIONS

European Search Report corresponding to application No. EP 01-11-3018 dated Sep. 13, 2004.

\* cited by examiner

*Primary Examiner*—Kevin Burd
*Assistant Examiner*—Juan Alberto Torres
(74) *Attorney, Agent, or Firm*—RatnerPrestia

(57) ABSTRACT

A transmitting circuit apparatus has a first digital modulator and a second digital modulator for modulating an I signal and a Q signal which are multi-valued digital baseband modulation signals, into a digital I signal and a digital Q signal, respectively, having the number of bits smaller than that of the baseband modulation signals; and a quadrature modulator for outputting a signal synthesized from the signals generated by modulating (two) carrier waves each having a phase perpendicular to each other by using the modulated I and Q signals, respectively.

6 Claims, 16 Drawing Sheets

$$A(z) = \frac{z^{-1}}{(1-z^{-1})^n} \quad \text{and} \quad B(z) = \frac{(1-z^{-1})^n - 1}{z^{-1}}$$

or $$A(z) = \frac{1}{(1-z^{-1})^n} \quad \text{and} \quad B(z) = (1-z^{-1})^n - 1$$

WIRELESS QUADRATURE MODULATOR TRANSMITTER USING E/O AND O/E CONNECTIVES

BACKGROUND OF THE INVENTION

1. Field of the Invention

The present invention relates to a transmitting circuit apparatus comprising a quadrature modulator used in wireless communications and the like.

2. Related Art of the Invention

In a transmitting circuit apparatus used in digital wireless communications by a modulation scheme such as QPSK, a quadrature modulator i s generally used as a modulator. FIG. 15 shows the basic configuration of a prior art transmitting circuit apparatus. In FIG. 15, numeral 403 indicates a quadrature modulator. Numeral 404 indicates a band-pass filter. Numeral 405 indicates an I-Q signal generator. Numeral 406 indicates a local oscillator. Numeral 407 indicates a phase shifter. Numerals 408 and 409 indicate mixers. Numeral 410 indicates a synthesizer. Numeral 411 indicates a power amplifier. The quadrature modulator 403 is composed of the phase shifter 407, the mixer 408, the mixer 409, and the synthesizer 410. The I-Q signal generator 405 outputs a baseband I signal and a baseband Q signal which are analogue signals, and then inputs them to the quadrature modulator 403. The local oscillator 406 outputs a sine wave signal at a carrier frequency. The sine wave signal is distributed into two signals each having a phase different from each other by 90 degrees by the phase shifter 407, and then the two signals are input to the mixer 408 and the mixer 409, respectively. The mixer 408 and the mixer 409 perform amplitude modulation on the respective signals each being at the carrier frequency and having a phase different from each other by 90 degrees by using the baseband I and Q signals. The modulated signals are synthesized by the synthesizer 410 into an output signal of the quadrature modulator 403. The output signal of the quadrature modulator 403 is amplified by the power amplifier 411, and then undergoes reduction of unnecessary frequency components by the band-pass filter 404, thereby being output.

FIG. 16 shows another example of a prior art transmitting circuit apparatus used in an optical base station for mobile communications and the like. In this configuration of the optical base station, in order to permit the use of wireless terminals even in underground malls and the like where the radio waves from a master station is not reachable, a master station having all the control functions of a base station is connected via an optical fiber to a slave station serving as a front end for wireless signals.

The configuration of FIG. 16 is basically similar to that of FIG. 15 except that the quadrature modulator 403 and the power amplifier 411 are interconnected via an optical fiber 425. Thus, like numerals are assigned to the like parts, and the detailed description is omitted. In FIG. 16, numeral 421 indicates a master station. Numeral 422 indicates a slave station. Numeral 423 indicates an E/O converter. Numeral 424 indicates an O/E converter. Numeral 420 indicates an antenna.

In the master station 421, the output signal of the quadrature modulator 403 is converted from an electric signal to an optical signal by the E/O converter 423 composed of a laser diode, and then transferred through the optical fiber 425 to the slave station 422. In the slave station 422, the received optical signal is converted to an electric signal by the O/E converter 424 composed of a photodiode, and then amplified by the power amplifier 411. After that, the signal undergoes reduction of unnecessary frequency components by the band-pass filter 404, and then is transmitted from the antenna 420.

In such prior art transmitting circuit apparatuses described above, the input signal to the quadrature modulator 403 is analogue, and hence the mixers 408, 409 need to be free from distortion. Accordingly, it is difficult to sufficiently increase the output level of the quadrature modulator 403. Thus, the power amplifier 411 is used for amplification, however, the power amplifier 411 also needs to be operated in the linear range causing only smaller distortion. This requires the operation at levels sufficiently lower than the saturation level. As a result, the power consumption of the power amplifier 411 has been rather large, and hence has prevented the reduction of overall power consumption of such a transmitting circuit apparatus.

Further, in the configuration of FIG. 16 which is another example of a prior art transmitting circuit apparatus used in an optical base station, in addition to the large power consumption of the power amplifier 411, linearity is required also for the E/O converter 423, the optical fiber 425, and the O/E converter 424. Accordingly, in spite of the simple configuration of the slave station, the linearity is difficult to ensure, and there is a problem of large power consumption.

SUMMARY OF THE INVENTION

Considering such problems in the prior art transmitting circuit apparatuses, an object of the present invention is to provide a transmitting circuit apparatus having a good linearity, a high transmission output power efficiency, and a small power consumption.

One aspect of the present invention is a transmitting circuit apparatus comprising: a first digital modulator and a second digital modulator for modulating an I signal and a Q signal which are multi-valued digital baseband modulation signals, into a digital I signal and a digital Q signal, respectively, having the number of bits smaller than that of said baseband modulation signals; and a quadrature modulator for outputting a signal synthesized from the signals generated by modulating (two) carrier waves each having a phase perpendicular to each other by using said modulated I and Q signals, respectively.

Another aspect of the present invention is a transmitting circuit apparatus, wherein said first and second digital modulators modulate said I and Q signals which are multi-valued digital baseband modulation signals into two-valued digital I and Q signals, respectively.

Still another aspect of the present invention is a transmitting circuit apparatus, wherein each of said first and second digital modulators comprises a sigma-delta modulator of at least second order or higher.

Yet another aspect of the present invention is a transmitting circuit apparatus, further comprising a first and a second band-pass filter for reducing unnecessary signals outside the transmission frequency band from said signals generated by modulating said carrier waves each having a phase perpendicular to each other by using said modulated I and Q signals, respectively, wherein said signals go through said first and second band-pass filters, respectively, and are then synthesized into an output signal of said quadrature modulator.

Still yet another aspect of the present invention is a transmitting circuit apparatus, further comprising a band-pass filter connected to the output of said quadrature modulator and for outputting a signal after reducing unnecessary signals outside the transmission frequency band from the output signal of said quadrature modulator.

A further aspect of the present invention is a transmitting circuit apparatus, wherein said quadrature modulator comprises a first and a second digital RF modulator each for performing amplitude modulation on each of said carrier waves having a phase perpendicular to each other, wherein said modulated I and Q signals control said first and second digital RE modulators, respectively, thereby to perform step-like amplitude modulation on said carrier waves, wherein the modulated signals are synthesized into a signal, and wherein the signal is then output.

A still further aspect of the present invention is a transmitting circuit apparatus, wherein each of said first and second digital RF modulators comprises a power amplifier, wherein each of said modulated I and Q signals controls the power supply of each of said power amplifiers thereby to perform amplitude modulation on each of said carrier waves, and wherein said amplitude-modulated signals are synthesized into an output signal of said quadrature modulator.

A yet further aspect of the present invention is a transmitting circuit apparatus, wherein each of said first and second digital RF modulators comprises an amplitude modulator and a power amplifier, wherein each of said carrier waves is modulated using each of said modulated I and Q signals by each of said amplitude modulators, and then amplified by each of said power amplifiers, and wherein said amplified signals are synthesized into an output signal of said quadrature modulator.

A still yet further aspect of the present invention is a transmitting circuit apparatus, wherein each of said first and second digital modulators comprises a power amplifier composed of a dual gate FET, wherein each of said carrier waves is input to the first gate of each of said dual gate FET's, wherein each of said modulated I and Q signals controls the output signal of each of said power amplifiers via the second gate terminal of the dual gate FET thereby to perform amplitude modulation on each of said carrier waves, and wherein said amplitude-modulated signals are synthesized into an output signal of said quadrature modulator.

An additional further aspect of the present invention is a transmitting circuit apparatus, wherein each of said power amplifiers constitutes a final amplifying stage, and hence no amplification circuit for the transmission signal is provided in the circuit in the stages after the quadrature modulator.

A still additional further aspect of the present invention is a transmitting circuit apparatus, comprising: E/O converters each for converting the output signal of each of said first and second digital modulators into an optical signal having a wavelength different from each other; and O/E converters each for converting the optical signal transferred from each of said E/O converters into an electric signal; wherein the output signal of each of said O/E converters is input to said quadrature modulator thereby to perform amplitude modulation on each of said carrier waves.

A yet additional aspect of the present invention is a transmitting circuit apparatus, wherein said digital I and Q signals converted into optical signals each having a different wavelength are transferred through a common optical fiber.

A still yet additional aspect of the present invention is a transmitting circuit apparatus, wherein each of said carrier waves is generated from the digital I or Q signal having been restored into an electric signal by each of said O/E converters.

A supplementary additional aspect of the present invention is a transmitting circuit apparatus, further comprising: another E/O converter for converting the output signal of a reference signal source into an optical signal having a wavelength different from those of the optical signals of said digital I and Q signals; and an O/E converter for converting the optical signal transferred from said E/O converter into an electric signal; wherein said carrier waves are generated from the output signal of said O/E converter.

A still supplementary aspect of the present invention is a transmitting circuit apparatus, wherein each of said sigma-delta modulators comprises an n-th-order integrator, a quantizer, and a feedback circuit, wherein a value input to said n-th-order integrator undergoes n-th-order integration and is then input to said quantizer thereby to be quantized into a digital value, wherein said quantized value serves as the output signal of said sigma-delta modulator, and at the same time, is input to said feedback circuit, and wherein the output signal of said feedback circuit is added to the input value of said sigma-delta modulator and the result is input to said n-th-order integrator.

A yet supplementary aspect of the present invention is a transmitting circuit apparatus, wherein each of said sigma-delta modulators comprises a plurality of lower-order sigma-delta modulators connected in multi-stage, wherein the output signal of each of said plurality of lower-order sigma-delta modulators is synthesized by connecting the output to a differentiator having a configuration expressed by a z transform A still yet supplementary aspect of the present invention is a transmitting circuit apparatus, wherein the output of each of said first and second sigma-delta modulators is provided with a digital filter having low-pass characteristics.

BRIEF DESCRIPTION OF THE DRAWINGS

FIGS. 5(*b*), 5(*c*), and 5(*d*) are diagrams each illustrating an example of a second-order integrator built in the modulator.

DESCRIPTION OF THE REFERENCE NUMERALS

Figure 1:
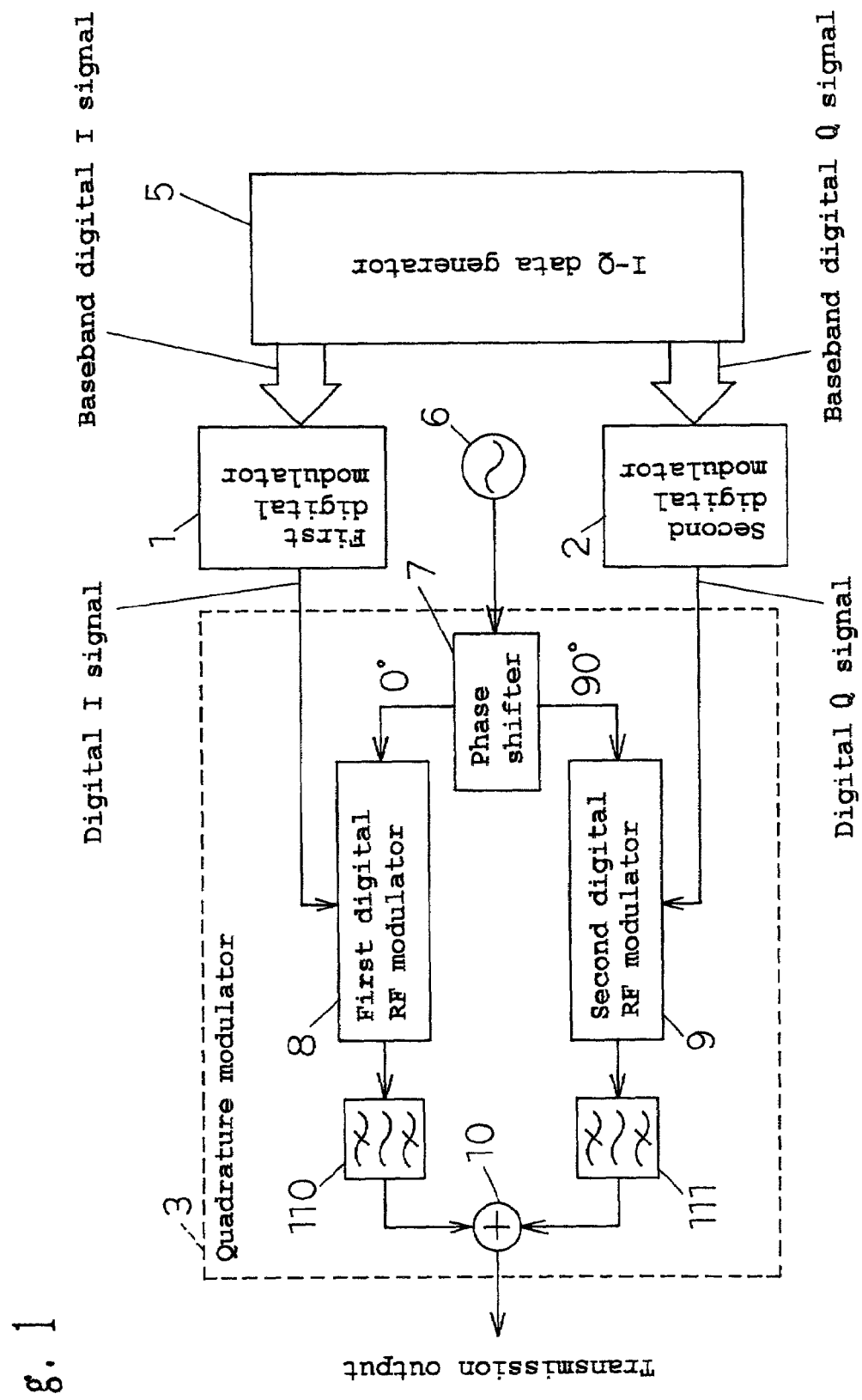
FIG. 1 is a configuration diagram of a transmitting circuit apparatus in accordance with Embodiment 1 of the present invention.

1 First digital modulator
2 Second digital modulator
3, 403 Quadrature modulator
4, 110, 111, 404 Band-pass filter
5 I-Q data generator
6, 406 Local oscillator
7, 407 Phase shifter
8 First digital RF modulator
9 Second digital RF modulator
10, 410 Synthesizer
21 Amplifier
22 Power supply controller
23 Amplitude modulator
25 Dual gate FET
31 n-th-order integrator
32 42, 202, 222 Quantizer
33 43, 203, 223 Feedback circuit
41 201, 221 Second-order integrator
101 Digital modulator
102 Sigma-delta modulator
103 Digital filter
200 First second-order sigma-delta modulator
220 Second second-order sigma-delta modulator
230 Second-order differential circuit
300 425 Optical fiber
301 421 Master station
302 422 Slave station
310 Clock signal reproducing circuit
321 Reference oscillator
405 I-Q signal generator

PREFERRED EMBODIMENTS OF THE INVENTION

The present invention is described below with reference to the drawings illustrating the embodiments thereof.

Embodiment 1

FIG. 1 is a configuration diagram of a transmitting circuit apparatus in accordance with Embodiment 1 of the present invention. In FIG. 1, numeral 1 indicates a first digital modulator. Numeral 2 indicates a second digital modulator. Numeral 3 indicates a quadrature modulator. Numeral 5 indicates an I-Q data generator. Numeral 6 indicates a local oscillator. The quadrature modulator 3 is composed of a phase shifter 7, a first digital RF modulator 8, a second digital RF modulator 9, a first band-pass filter 110, a second band-pass filter 111, and a synthesizer 10.

The operation of the above-mentioned transmitting circuit apparatus of Embodiment 1 is described below with reference to the drawings.

First, the I-Q data generator 5 outputs a baseband I signal to the first digital modulator 1, and outputs a baseband Q signal to the second digital modulator 2. Here, the baseband I and Q signals are multi-valued digital signals. The first digital modulator 1 performs sigma-delta modulation on the input signal, thereby outputting a digital I signal having the number of bits smaller than that of the baseband modulation signal. Similarly, the second digital modulator 2 performs sigma-delta modulation on the input signal, thereby outputting a digital Q signal.

A local signal output from the local oscillator 6 is separated by the phase shifter 7 into two signals each of which is at a carrier frequency and has a phase different from each other by 90 degrees. The two signals are input to the first digital RF modulator 8 and the second digital RF modulator 9, respectively. The carrier wave signal input to the first digital RF modulator 8 undergoes step-like amplitude modulation by using the output signal of the first digital modulator 1, while the carrier wave signal having a phase different by 90 degrees and being input to the second digital RF modulator 9 undergoes step-like amplitude modulation by using the output signal of the second digital modulator 2. The output signal of the first digital RF modulator 8 is input through the first band-pass filter 110 to the synthesizer 10, while the output signal of the second digital RF modulator 9 is input through the second band-pass filter 111 to the synthesizer 10. These input signals are added to each other by the synthesizer 10, thereby becoming a transmission output signal of the quadrature modulator 3. The first band-pass filter 110 and the second band-pass filter 111 are provided in order to reduce unnecessary signal components occurring in the output signals of the first digital RF modulator 8 and the second digital RF modulator 9, respectively. In the configuration of FIG. 1, the band-pass filters 110, 111 reduce unnecessary frequency components before synthesis.

It is sufficient for the digital RF modulators to accurately output only those levels corresponding to the values of digital I-Q signals having a small number of bits. Accordingly, digital RF modulators having a low linearity can be used. Thus, the components in the digital RF modulators can be used in a nearly saturated state. This permits efficiency improvement. Further, because only a small number of components depend on analogue characteristics, linearity is easily ensured.

Figure 2:
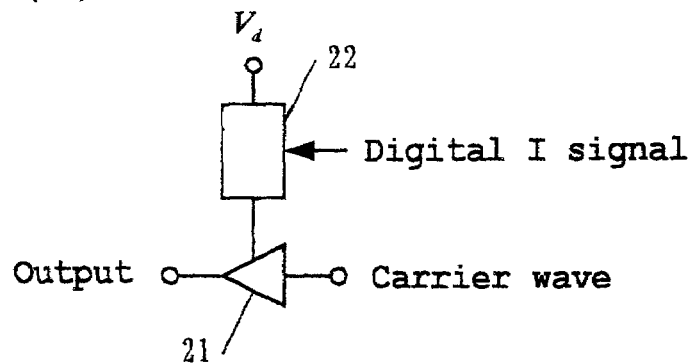
FIG. 2 is a configuration diagram of a digital RF modulator in accordance with Embodiment 1.
Figure 2:
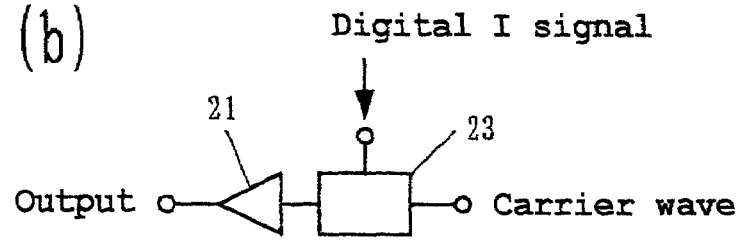
Figure 2:
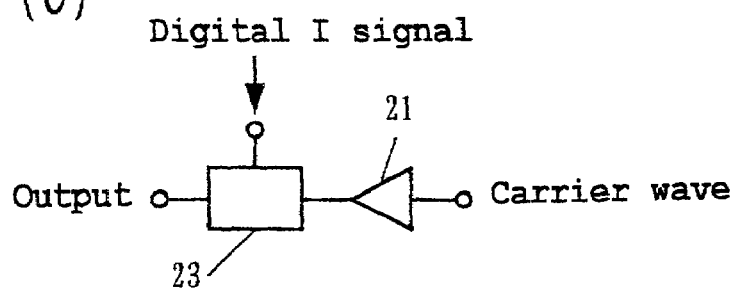
Figure 2:
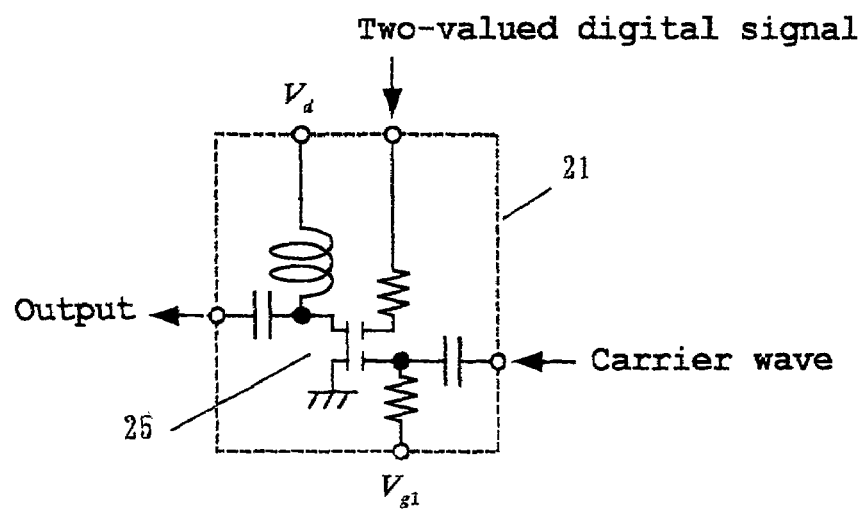

FIG. 2(a) shows an example of the configuration of the first digital RF modulator 8. A power supply controller 22 is controlled by a two-valued digital I signal thereby to change step-like the supply voltage to an amplifier 21, thereby causing the average amplitude of output signal to be proportional to each level of the digital I signal. It is sufficient that the output amplitude is defined only at each input point. Accordingly, even in case that the characteristics of the amplifier 21 is non-linear, the problem is avoided by inputting the supply voltage to the amplifier 21 at a level appropriate to the non-linearity.

Figure 13A:
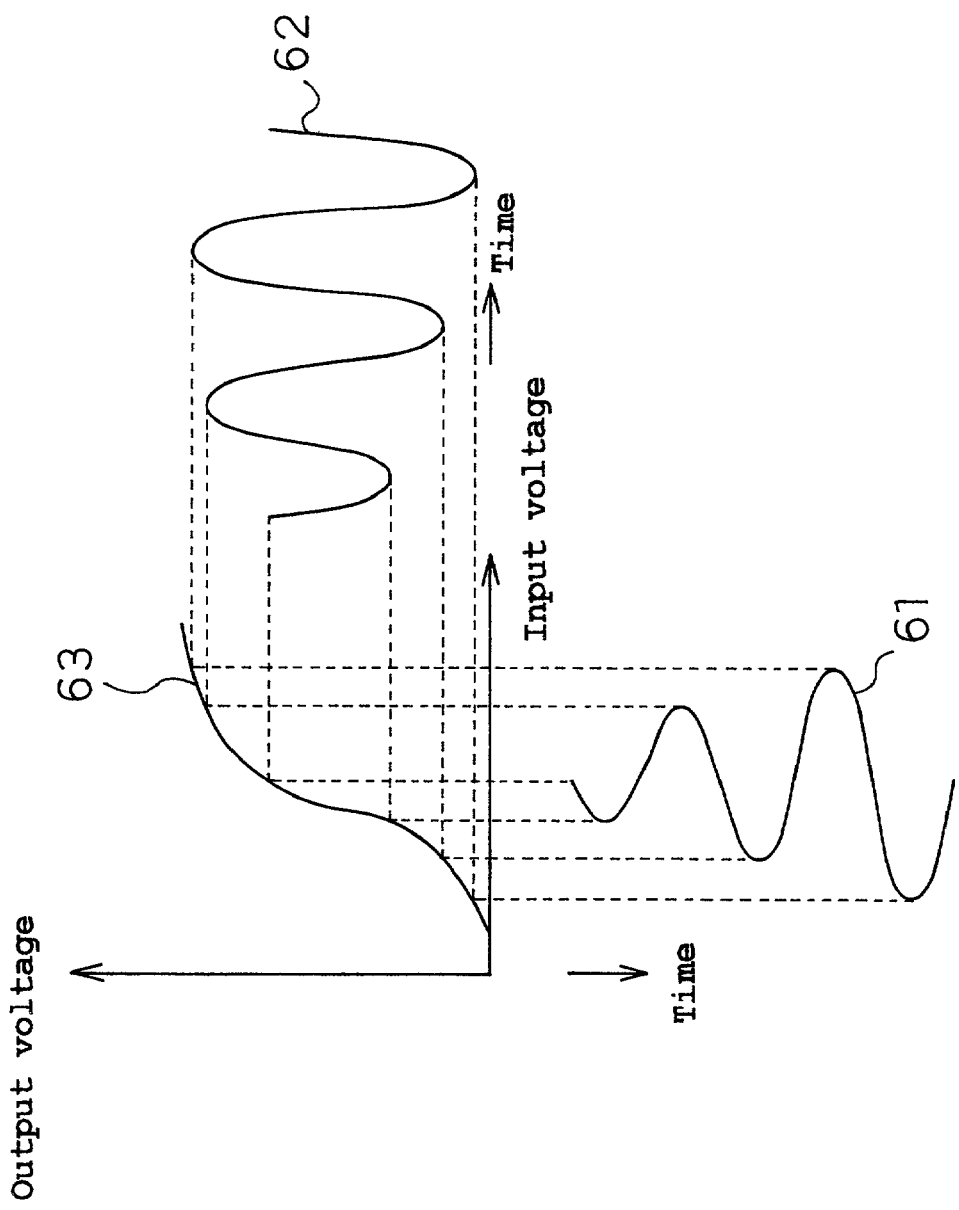
FIG. 13(*a*) is a conceptual diagram illustrating the case that an analogue signal of the Embodiment 1 of the present invention is amplified by an amplifier having non-linear characteristics.
FIG. 13(b) is a conceptual diagram illustrating the case that a digital signal of the Embodiment 1 of the present invention is amplified by an amplifier having non-linear characteristics.
Figure 13:
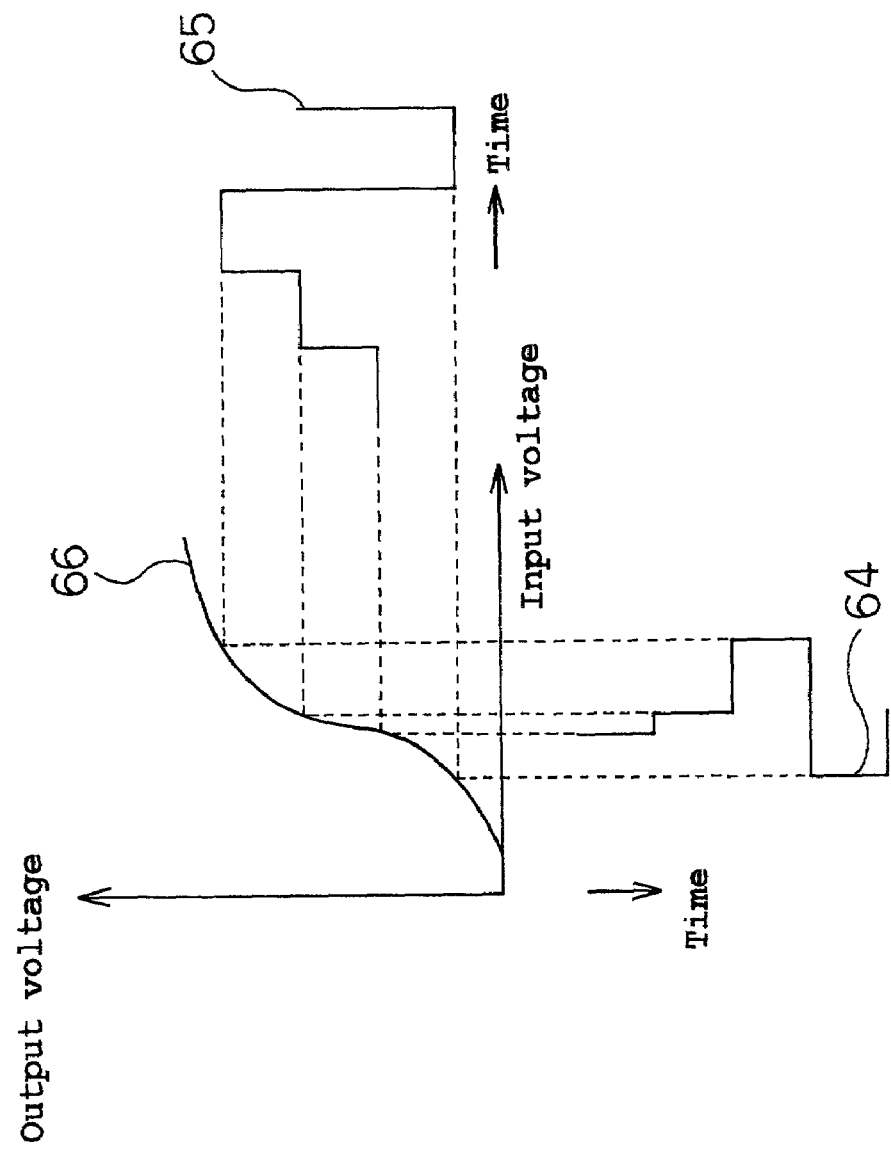

This situation is explained below with reference to a schematic diagram shown in FIG. 13. FIG. 13(a) is a schematic diagram illustrating the situation that an amplifier having input/output characteristics 63 amplifies an input signal 61 thereby to output an output signal 62. In FIG. 13(a), the input signal 61 is an analogue signal, and further the input/output characteristics 63 is non-linear. FIG. 13(b) is a schematic diagram illustrating the situation that an amplifier having input/output characteristics 66 amplifies an input signal 64 thereby to output an output signal 65. In FIG. 13 (b), the input signal 64 is a digital signal the voltage of which varies step-like, and further the input/output characteristics 66 is non-linear.

In FIG. 13(a), because of the non-linearity in the input/output characteristics 63, amplification of the input signal 61 by the amplifier causes a distortion in the output signal 62 as shown. In order to correct the distortion in the output signal 62, it might be thought to be effective to make a previous change in the input signal 61 such that the change corrects the non-linearity of the input/output characteristics 63. Nevertheless, since the input signal 61 is an analogue signal, the input/output characteristics 63 needs to be taken into consideration over the whole of the input signal 61. Accordingly, the approach of making a previous change in the input signal 61 is almost impossible.

In contrast, in FIG. 13(b), the input signal 64 is a digital signal the voltage of which varies step-like. Accordingly, even in case that the input/output characteristics 66 of the amplifier is non-linear, the output signal 65 is output without distortion by making an adjustment only for the possible values of the step-like input signal 64. Actually in FIG. 13(b), the spacing among the possible values of the input signal 64 is previously adjusted such that the spacing among possible steps of the output signal 65 is identical to each other.

As such, in case of a digital signal the supply voltage of which has step-like values, even if the characteristics of the amplifier 21 is non-linear, a desired output signal is obtained by inputting a supply voltage to the amplifier 21 at a level appropriate to the non-linearity.

Figure 14:
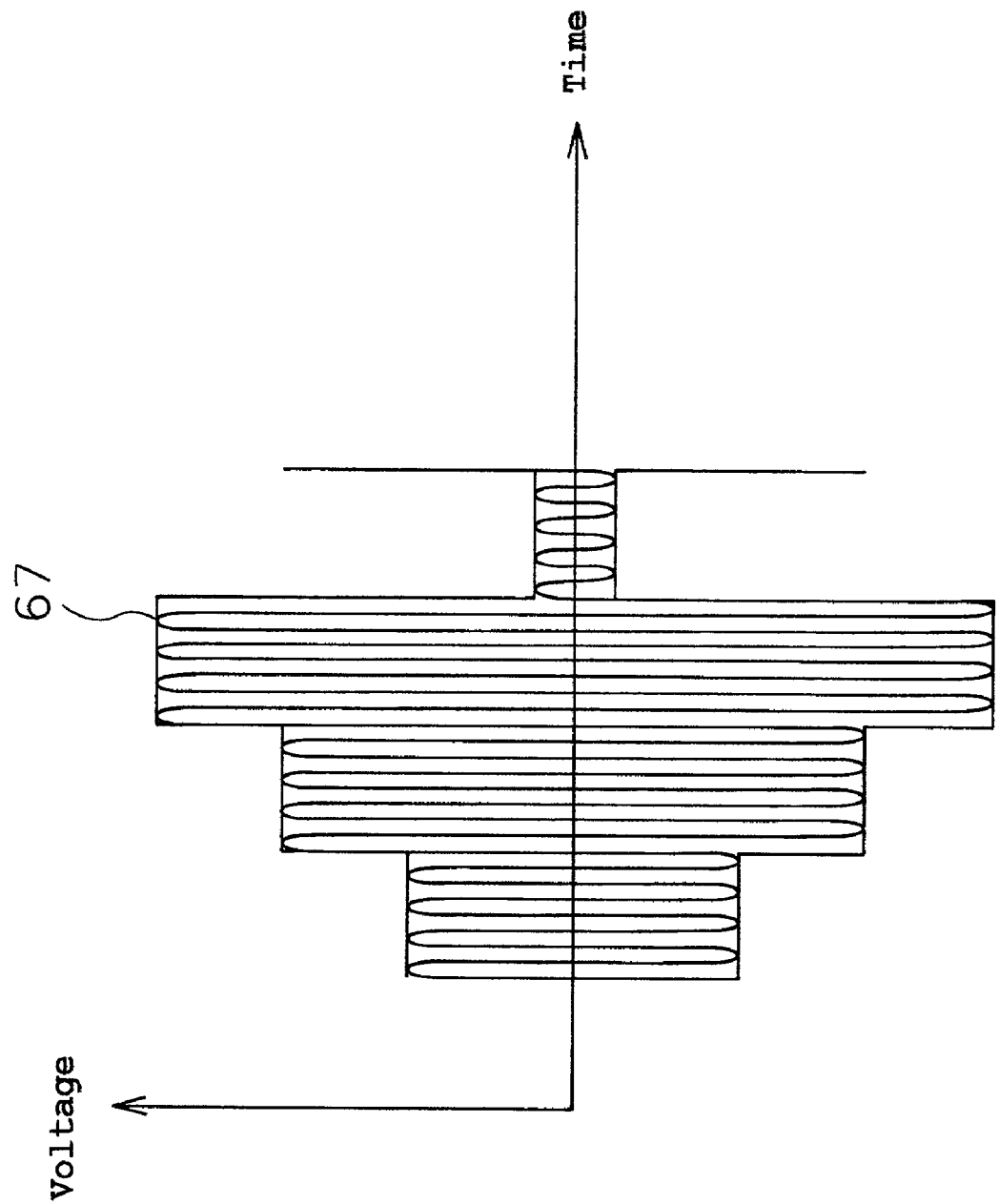
FIG. 14 is a diagram of an example of a carrier wave in accordance with Embodiment 1.
Figure 15:
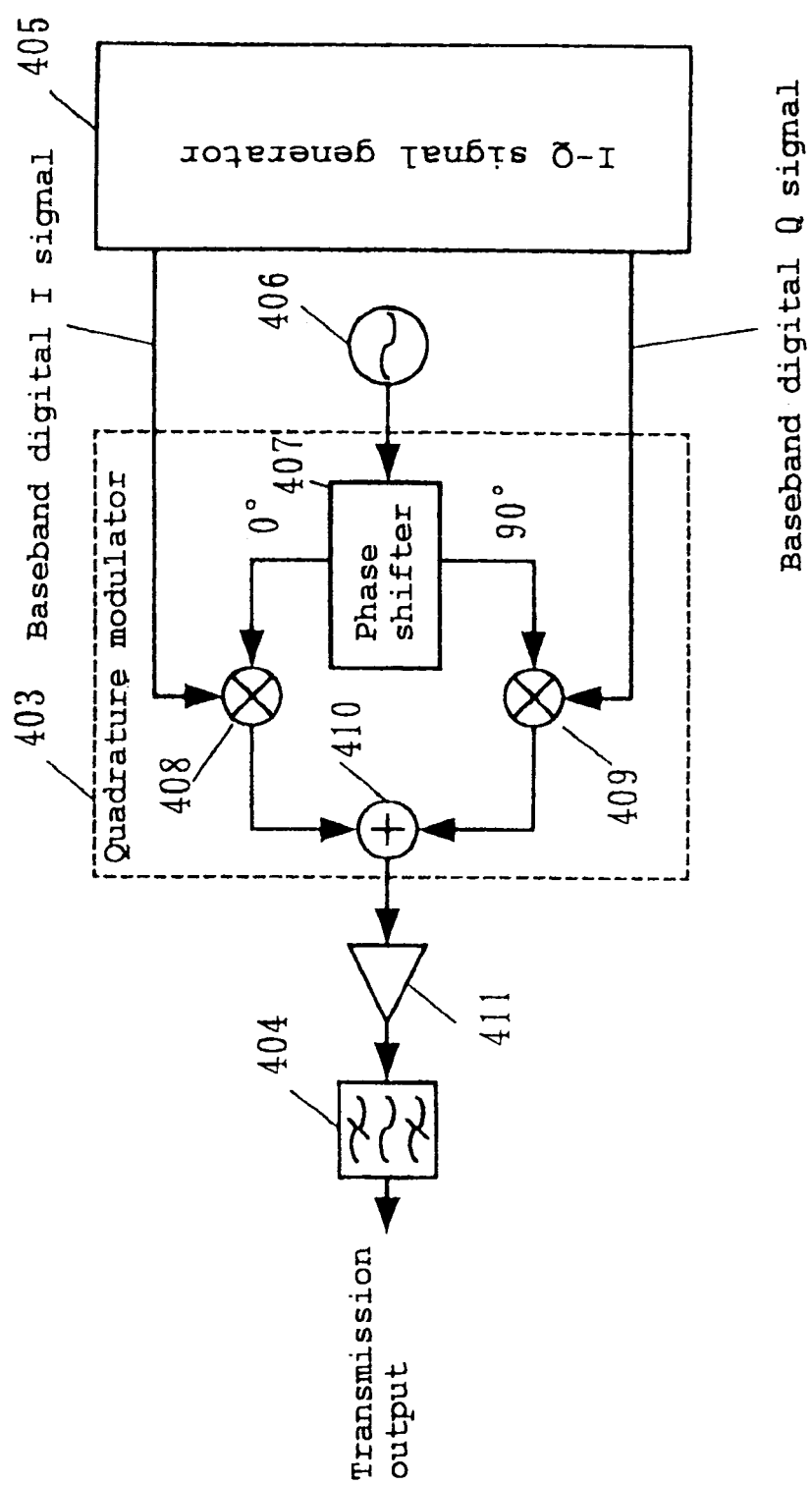
FIG. 15 is a configuration diagram of an example of a prior art transmitting circuit apparatus.
Figure 16:
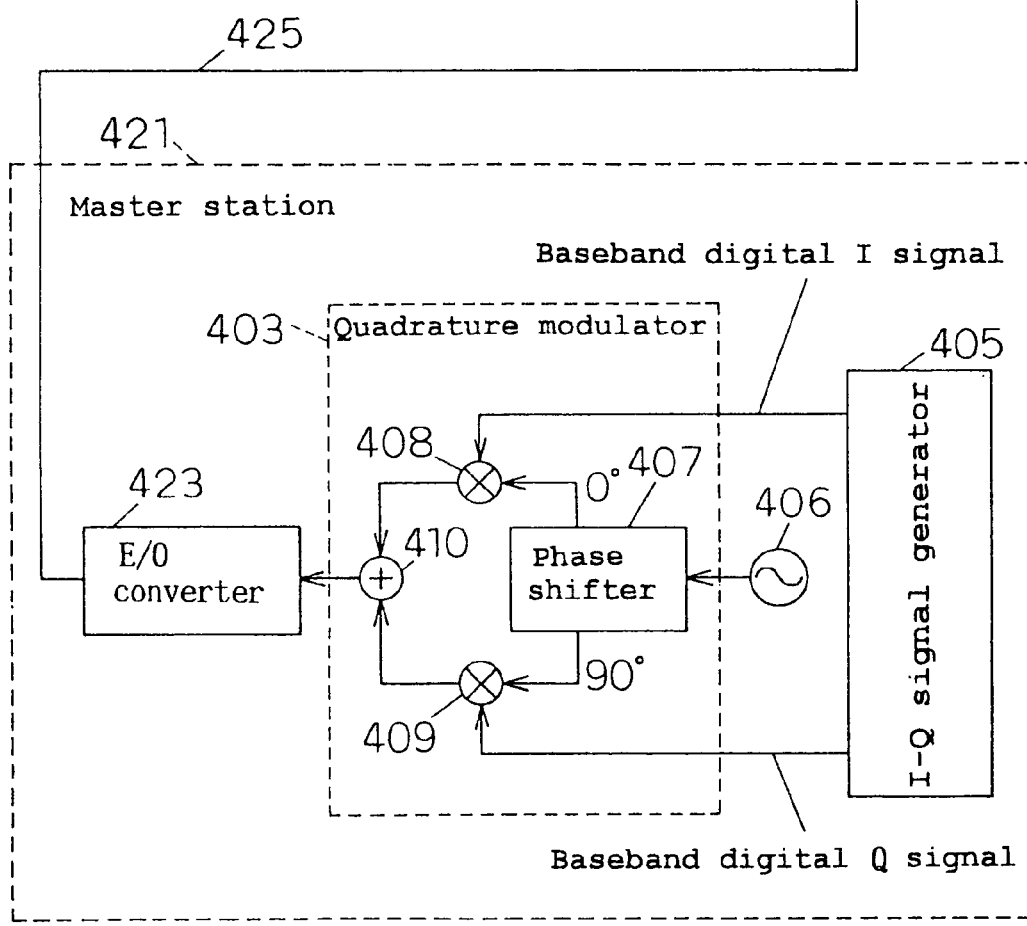
FIG. 16 is a configuration diagram of another example of a prior art transmitting circuit apparatus.

Further, since the function of the amplifier 21 is only to amplify the carrier wave having a sine-wave shape at each of the step-like voltage levels, no distortion occurs basically except for higher harmonics. FIG. 14 shows an example of a carrier wave 67 to be amplified by the amplifier 21. The carrier wave 67 is a signal in which the amplitude of the sine wave varies step-like. Accordingly, even in case that the characteristics of the amplifier 21 is non-linear, no distortion occurs except for higher harmonics when the carrier wave 67 is amplified by the amplifier 21. Thus, even in case that the amplifier 21 is operated under a nearly saturated condition, only a small distortion occurs in the vicinity of the transmission output. Further, no current flows in the OFF state. This permits efficiency improvement. The situation is identical also for the second digital RF modulator 9.

FIG. 2(b) shows another example of the configuration of the first digital RF modulator 8. An amplitude modulator 23 is controlled by a digital I signal. A carrier wave is controlled step-like by the amplitude modulator 23, thereby being input to an amplifier 21 for amplification. When the amplifier 21 is operated under a bias condition near a class-B or class-C operation, the power consumption is reduced in the OFF-input state. The situation is identical also for the second digital RF modulator 9.

FIG. 2(c) shows an example of the configuration in which the positions of the amplitude modulator 23 and the amplifier 21 are exchanged in comparison with FIG. 2(b). An amplifier 21 for amplifying a carrier wave is operated under a nearly saturated condition for the maximum output. Accordingly, current consumption is small. This reduces the variation in power supply of the amplifier itself, and hence permits a stable operation.

FIG. 2(d) shows another example of the configuration of the first digital RF modulator 8. An amplifier 21 comprises a dual gate FET 25. A carrier wave is input to the first gate, and is output after amplification. A digital I signal is input to the second gate, thereby controlling step-like the output level of the amplifier 21. By virtue of the dual gate FET 25, both the characteristics of high-speed control and the characteristics of high-gain amplification are easily obtained. The situation is identical also for the second digital RF modulator 9.

In FIGS. 2(a), 2(b), and 2(d), in case that the digital I signal is two-valued, the amplifier 21 performs a simple ON/OFF operation. This improves power consumption substantially. Further, in FIGS. 2(b) and 2(c), the amplitude modulator 23 maybe composed of an RF switch. This causes a simple configuration. Furthermore, in FIGS. 2(a) to 2(d), when the amplifier within the digital RF modulator is the final amplification stage of the overall transmitting circuit apparatus, a high efficiency is obtained for the overall apparatus.

Figure 3:
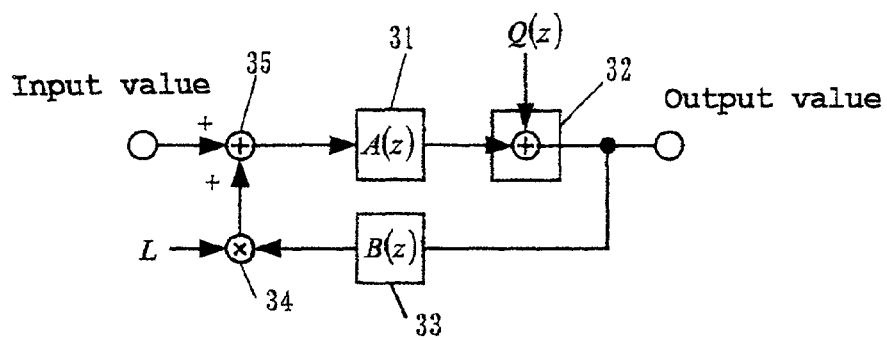
FIG. 3 is a configuration diagram of an example of a sigma-delta modulator in accordance with Embodiment 1.

FIG. 3 shows an example of the configuration of a sigma-delta modulator in which sigma-delta modulation is carried out by a first digital modulator 1 and a second digital modulator 2. In FIG. 3, numeral 31 indicates an n-th-order integrator. Numeral 32 is a quantizer. Numeral 33 is a feedback circuit. Numeral 34 is a multiplier. Numeral 35 is an adder. The quantizer 32 quantizes the output signal of the n-th-order integrator 31 by the quantization unit L, and then outputs the result. The quantized output value goes through the feedback circuit 33, and is then multiplied by the quantization unit L in the multiplier 34. The resultant value is added to the input value in the adder 35. The result is input to the n-th-order integrator 31 thereby to undergo n-th-order integration, and is then output.

The operation A(z) of the n-th-order integrator 31 is expressed by a z transform $$A(z)=z^{-1}/(1-z^{-1})^n$$

Further, the operation B(z) of the feedback circuit 33 is expressed by a z transform $$B(z)=((1-z^{-1})^n-1)/z^{-1}$$

Here, $z^{-1}$ indicates one clock delay element which is implemented by a D-flipflop. The quantizer 32 performs division of the input value by the quantization unit L, thereby outputting the integer part of the quotient. The division is implemented by outputting only the figures greater than or equal to the quantization unit L. Further, the multiplication by the quantization unit L in the multiplier 34 and the addition in the adder 35 are implemented by simply adopting the output value of the feedback circuit 33 as the most significant bits of the input value.

With an input value F and an output value Y, the operation of the configuration shown in FIG. 3 is expressed by $$Y=F/L \cdot z^{-1}+(1-z^{-1})^n Q$$

This indicates the operation of an n-th-order sigma-delta modulator. Further, in case that $A(z)=1/(1-z^{-1})$ and that $B(z)=((1-z^{-1})^n-1)$, the operation is expressed by $$Y=F/L+(1-z^{-1})^n Q$$

This indicates the operation of a similar n-th-order sigma-delta modulator apart from a shift by one clock period.

On the other hand, the frequency characteristics corresponding to $$|1-z^{-1}|$$

is expressed by $$|2 \sin(\pi f/fs)|$$

with a clock frequency fs. In the configuration of FIG. 3, the quantization noise Q is multiplied by the frequency characteristics of $$|2 \sin(\pi f/fs)|^n$$

Figure 4:
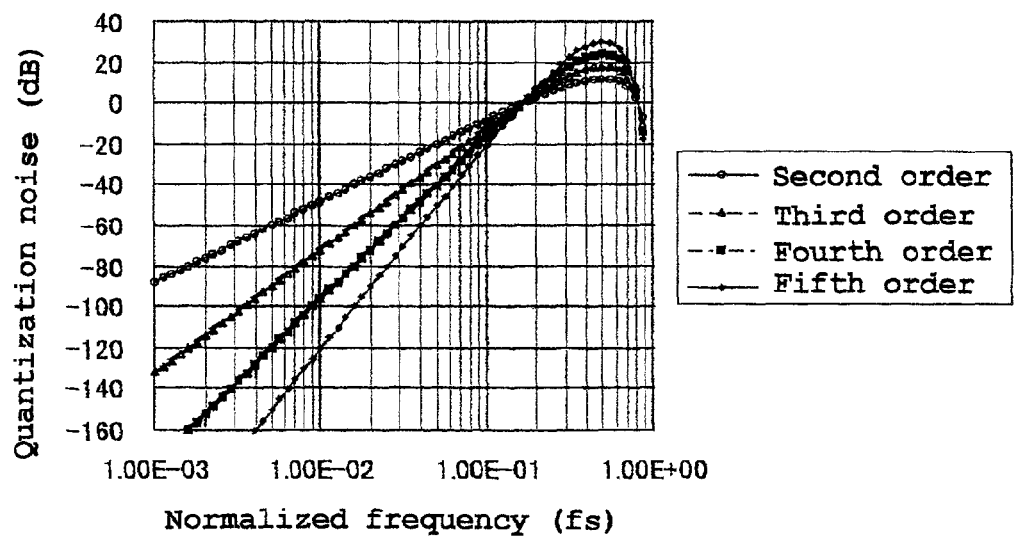
FIG. 4 is a diagram of the frequency characteristics of the sigma-delta modulator of FIG. 3.

FIG. 4 shows the frequency characteristics of the quantization noise as a function of the degree of the sigma-delta modulator shown in FIG. 3. As shown in FIG. 4, with increasing degree of order, the level of quantization noise is further reduced in lower frequency range. This indicates that in the lower frequency range, an output signal is obtained with suppressing the quantization noise even in case of an output signal having the number of bits smaller than that of the input value. Further, a higher clock frequency much improves the situation.

FIG. 5(a) shows an example of the configuration of a second-order sigma-delta modulator which corresponds to the case of n=2 in FIG. 3. In FIG. 5(a), numeral 41 indicates a second-order integrator. Numeral 42 is a quantizer. Numeral 43 is a feedback circuit. Numeral 47 is a multiplier. Numeral 48 is an adder. Numeral Q indicates a quantization error added in the quantizer 42.

An input value undergoes addition by the output value of the multiplier 47 in the adder 48, and is then input to the second-order integrator 41. The output value of the second-order integrator 41 is quantized by the quantizer 42. The quantized output value is input to the feedback circuit 43. The output value of the feedback circuit 43 is multiplied by the quantization unit L in the multiplier 47, and then input to the adder 48. Here, the feedback circuit 43 is composed of a delay circuit 44, a doubling circuit 45, and an adder 46. The output of the quantizer 42 is connected to the delay circuit 44 and the doubling circuit 45. The adder 46 subtracts the output value of the doubling circuit 45 from the output value of the delay circuit 44, thereby outputting the result to the adder 47. The doubling circuit 45 outputs the value of double the input value, and is implemented by a configuration in which the data is shifted by one bit in the higher-order direction and in which the LSB is set to be zero. The delay circuit 44 outputs the input value with a delay of one clock period.

The operation of the second-order integrator 41 is expressed by a z transform $$z^{-1}/(1-z^{-1})^2$$

where $z^{-1}$ indicates a delay of one clock period. FIGS. 5(b), 5(c), and 5(d) show examples of the configuration of the second-order integrator 41. In FIG. 5(b), an adder 51 and a delay circuit 52 constitute a first-order integrator. An input value X1 undergoes addition by the output value of the delay circuit 52 in the adder 51. The output value of the adder 51 is then input to the delay circuit 52. The operation of the first-order integrator is expressed by a z transform $1/(1-z^{-1})$. Similarly, an adder 53 and a delay circuit 54 constitute a first-order integrator. The output value of the adder 51 is input to the adder 53, thereby undergoing addition by the output value of the delay circuit 54. The output value of the adder 53 is then input to the delay circuit 54. The output value of the delay circuit 54 becomes the output value X2 of the second-order integrator. The delay circuits 52, 54 output the respective input values with a delay of one clock period. Since the output signal of the second-order integrator is the output signal of the delay circuit 54, the operation of the overall second-order integrator is expressed by a z transform $$z^{-1}/(1-z^{-1})^2$$

FIG. 5(c) shows an example of the configuration in which the two first-order integrators are interconnected in a manner different from that of FIG. 5(b). The operation of the overall second-order integrator is expressed by a z transform $$z^{-1}/(1-z^{31\ 1})^2$$

Thus, the input/output operation is identical to that of FIG. 5(b).

In FIG. 5(d), numeral 71 indicates an adder. Numeral 72 indicates a delay circuit. The adder 71 adds an input value X1 to the output value of an adder 75, thereby outputting the result to the delay circuit 72. The output value of the delay circuit 72 is input to a doubling circuit 74 and a delay circuit 73, and at the same time, serves as an output value X2 of the second-order integrator. The delay circuits 72, 73 output the respective input values with a delay of one clock period. The doubling circuit 74 outputs the value of double the input value. The adder 75 outputs the result of subtraction of the output value of the delay circuit 73 from the output value of the doubling circuit 74, into the adder 71. Also in this configuration, the operation of the overall second-order integrator is expressed by a z transform $$z^{-1}/(1-z^{-1})^2$$

In the sigma-delta modulator having the above-mentioned configuration, the quantizer 42 outputs the integer part alone of the quotient of the input value divided by L. The operation of the feedback circuit 43 is expressed by a z transform ($z^{-1}$ −2).

Therefore the operation of the overall circuit of FIG. 5(a) is expressed by a z transform $$Y=z^{-1}F/L+(1-z^{-1})^2Q$$

with the output value Y.

Figure 5:
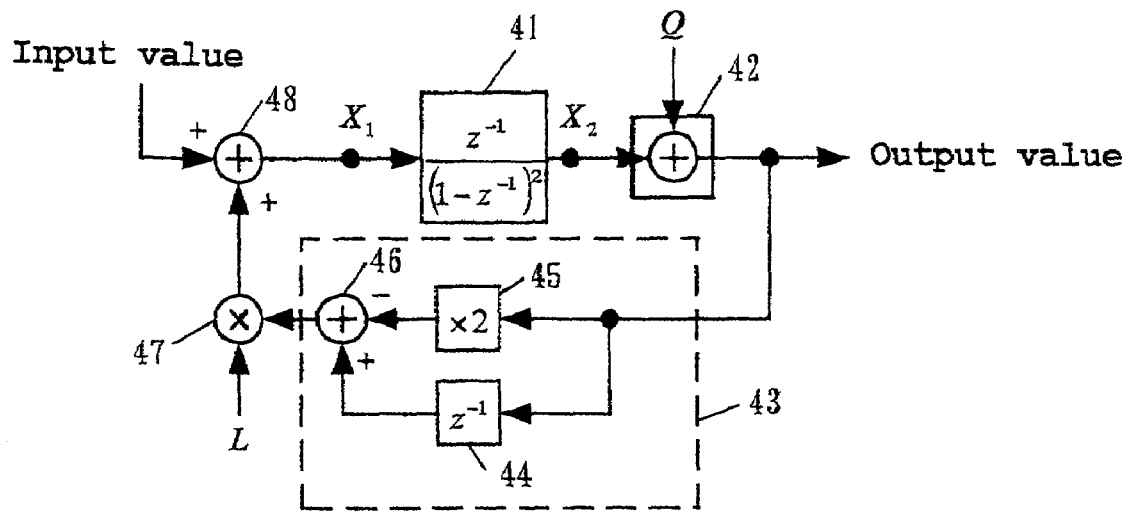
FIG. 5(*a*) is a configuration diagram of a second-order sigma-delta modulator in accordance with Embodiment 1.
Figure 5:
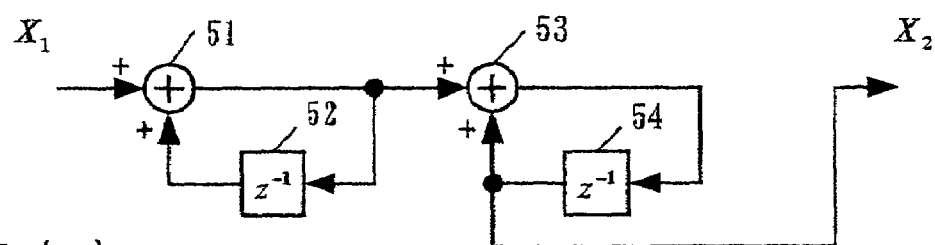
Figure 5:
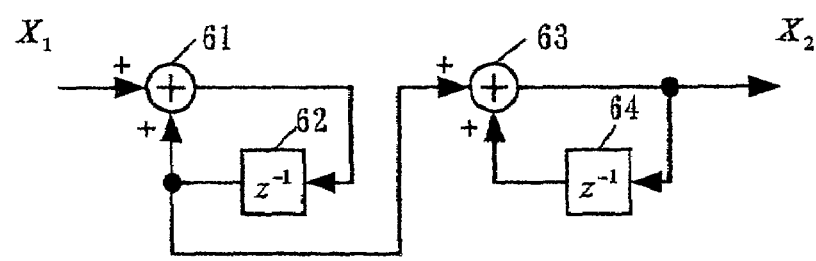
Figure 5:
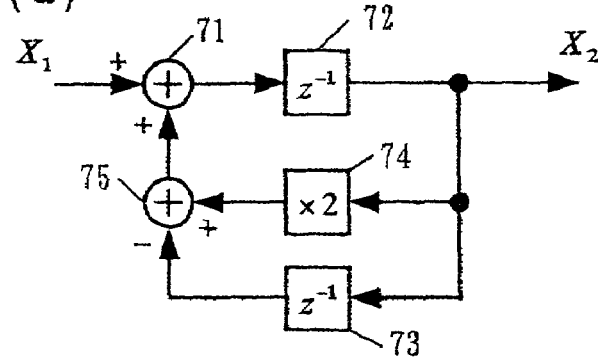
Figure 6:
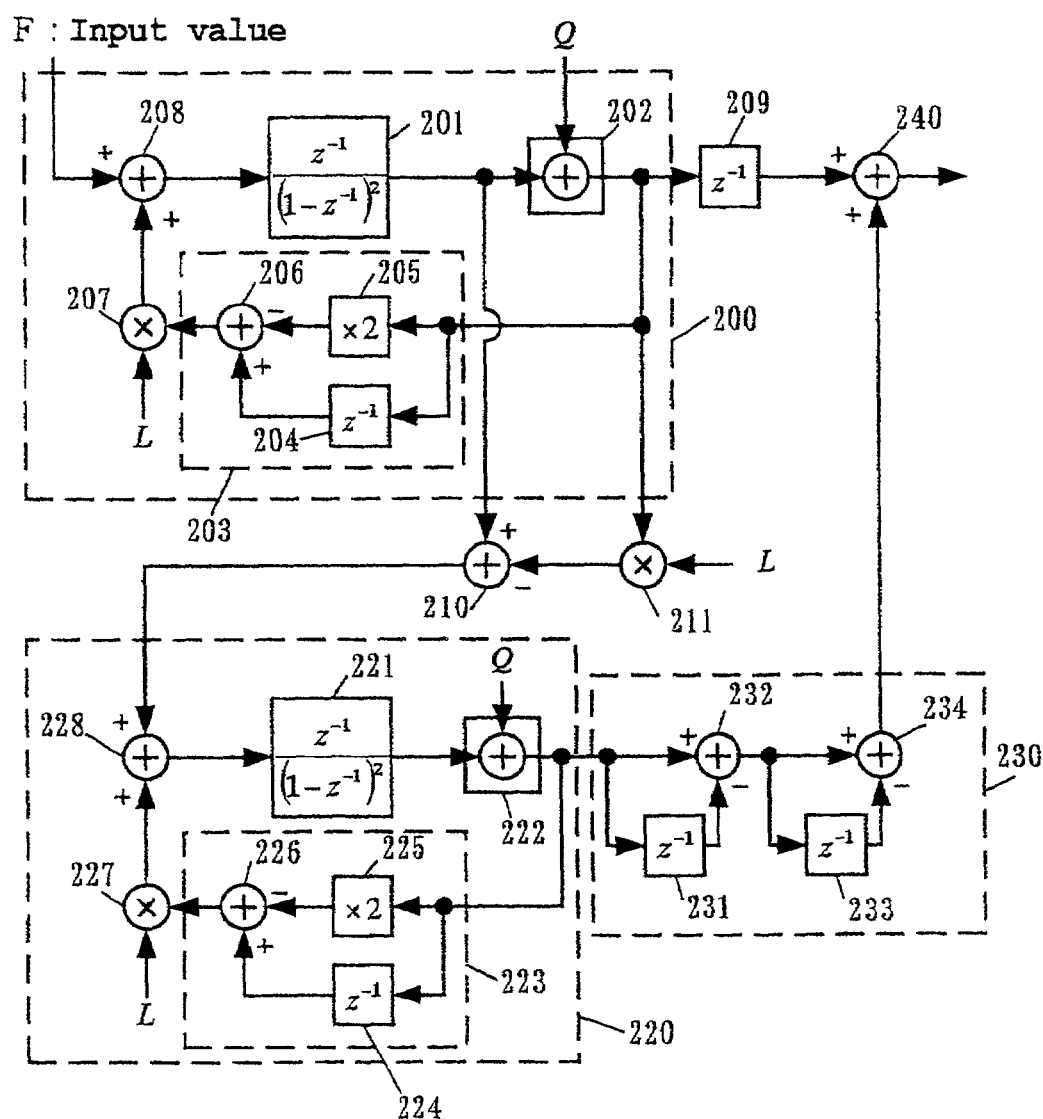
FIG. 6 is a configuration diagram of a fourth-order sigma-delta modulator in accordance with Embodiment 1.

FIG. 6 shows a fourth-order sigma-delta modulator constructed by connecting two circuits shown in FIG. 5. In FIG. 6, numeral 200 indicates a first second-order sigma-delta modulator. Numeral 220 indicates a second second-order sigma-delta modulator. Numeral 230 indicates a second-order differential circuit. The first second-order sigma-delta modulator 200 is composed of a second-order integrator 201, a quantizer 202, a feedback circuit 203, a multiplier 207, and an adder 208. The feedback circuit 203 is composed of a delay circuit 204, a doubling circuit 205, and an adder 206. The second second-order sigma-delta modulator 220 is composed of a second-order integrator 221, a quantizer 222, a feedback circuit 223, a multiplier 227, and an adder 228. The feedback circuit 223 is composed of a delay circuit 224, a doubling circuit 225, and an adder 226. The first second-order sigma-delta modulator 200 and the second second-order sigma-delta modulator 220 have the same configuration as shown in FIG. 5(a), and hence detailed description is omitted.

In the configuration of FIG. 6, the fraction part data being input from the outside is input to the first second-order sigma-delta modulator 200. The output of the quantizer 202 of the first second-order sigma-delta modulator 200 is connected to a delay circuit 209. An adder 210 subtracts the output value of a multiplier 211 from the input value of the quantizer 202 of the first second-order sigma-delta modulator 200, thereby inputting the result to the second second-order sigma-delta modulator 220. The multiplier 211 multiplies the output value of the quantizer 202 by the quantization unit L, thereby outputting the result to the adder 210. The output value of the quantizer 222 of the second second-order sigma-delta modulator 220 is input to a second-order differential circuit 230. The second-order differential circuit 230 is composed of a delay circuit 231, an adder 232, a delay circuit 233, and an adder 234. The pair of delay circuit 231 and the adder 232 and the pair of the delay circuit 233 and the adder 234 constitute first-order differential circuits, respectively. The input value of the second-order differential circuit 230 is input to the delay circuit 231 and the adder 232. The adder 232 subtracts the output value of the delay circuit 231 from the input value of the second-order differential circuit 230, thereby inputting the result to the delay circuit 233 and the adder 234 in the next stage. The adder 234 subtracts the output value of the delay circuit 233 from the output value of the adder 232 which is the output value of the preceding stage, thereby outputting the result. The adder 240 adds the output value of the delay circuit 209 to the output value of the second-order differential circuit 230, thereby outputting the result as the output value of the overall circuit.

Described below is the operation of the sigma-delta modulator having the above-mentioned configuration. The operation of the first second-order sigma-delta modulator 200 is expressed by a z transform $$Y1=z^{-1}F/L+(1-z^{-1})^2Q1$$

where Y1 indicates the output, and Q1 indicates the quantization error added in the quantizer 202. The operation of the second second-order sigma-delta modulator 220 is expressed by a z transform $$Y2=z^{-1}F2/L+(1-z^{-1})^2Q2$$

where F2 indicates the input, Y2 indicates the output, and Q2 indicates the quantization error added in the quantizer 222. Here, since F2=–L Q1, the expression $$Y2=-z^{-1}Q1+(1-z^{-1})^2Q2$$

is concluded. Further, the operation of the second-order differential circuit 230 is expressed by a z transform $$(1-z^{-1})^2$$

Accordingly, the output value Y3 of the second-order differential circuit 230 is expressed by $$Y3=(1-z^{-1})^2Y2=-z^{-1}(1-z^{-1})^2Q1+(1-z^{-1})^4Q2$$

Therefore, the output value Y4 of the adder 240 is expressed by $$Y4=z^{-1}Y1+Y3=-z^{-2}F/L+(1-z^{-1})^4Q2$$

This indicates the operation of a fourth-order sigma-delta modulator.

As described above, the frequency characteristics corresponding to $$|1-z^{-1}|$$

is expressed by $$|2 \sin(\pi f/fs)|$$

with a clock frequency fs. Accordingly, in the fourth-order sigma-delta modulator of FIG. 6, the quantization noise Q is multiplied by the frequency characteristics of $$|2 \sin(\pi f/fs)|^4$$

Thus, the quantization noise in lower frequency range is suppressed further in comparison with the case of the coefficient of the quantization noise Q in the above-mentioned second-order sigma-delta modulator In general, in a combination of a first n-th-order sigma-delta modulator and a second m-th-order sigma-delta modulator (where each of n and m is greater than or equal to unity), the overall circuit can serve as an (n+m)-th-order sigma-delta modulator when an n-th-order differential circuit is provided in the output of the second m-th-order sigma-delta modulator so as to match the delay with that of the output signal of the first n-th-order sigma-delta modulator. A combination of three or more modulators works obviously in a similar manner.

Figure 7:
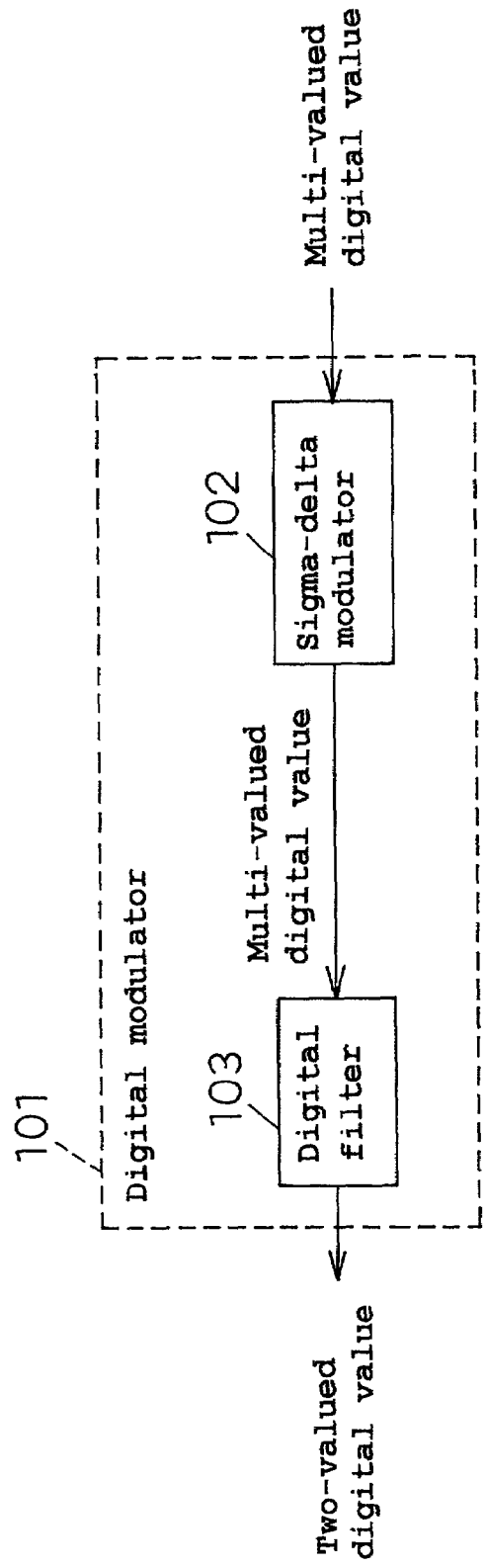
FIG. 7 is a configuration diagram of an example of a digital modulator in accordance with Embodiment 1.

FIG. 7 shows the case that a digital filter having low-pass characteristics is provided in the output of the sigma-delta modulator for outputting a multi-valued digital signal in the digital modulator of FIG. 1. The output signal of a higher-order sigma-delta modulator having the configuration of FIG. 3 or a combination thereof is generally a multi-valued signal. A digital filter 103 has low-pass characteristics, and hence reduces quantization noise the level of which is higher in higher frequency range as shown in FIG. 4. After that, the signal is converted to a two-valued digital signal, whereby the two-valued digital signal almost free from the quantization noise is obtained from the input signal of the digital modulator.

Figure 8:
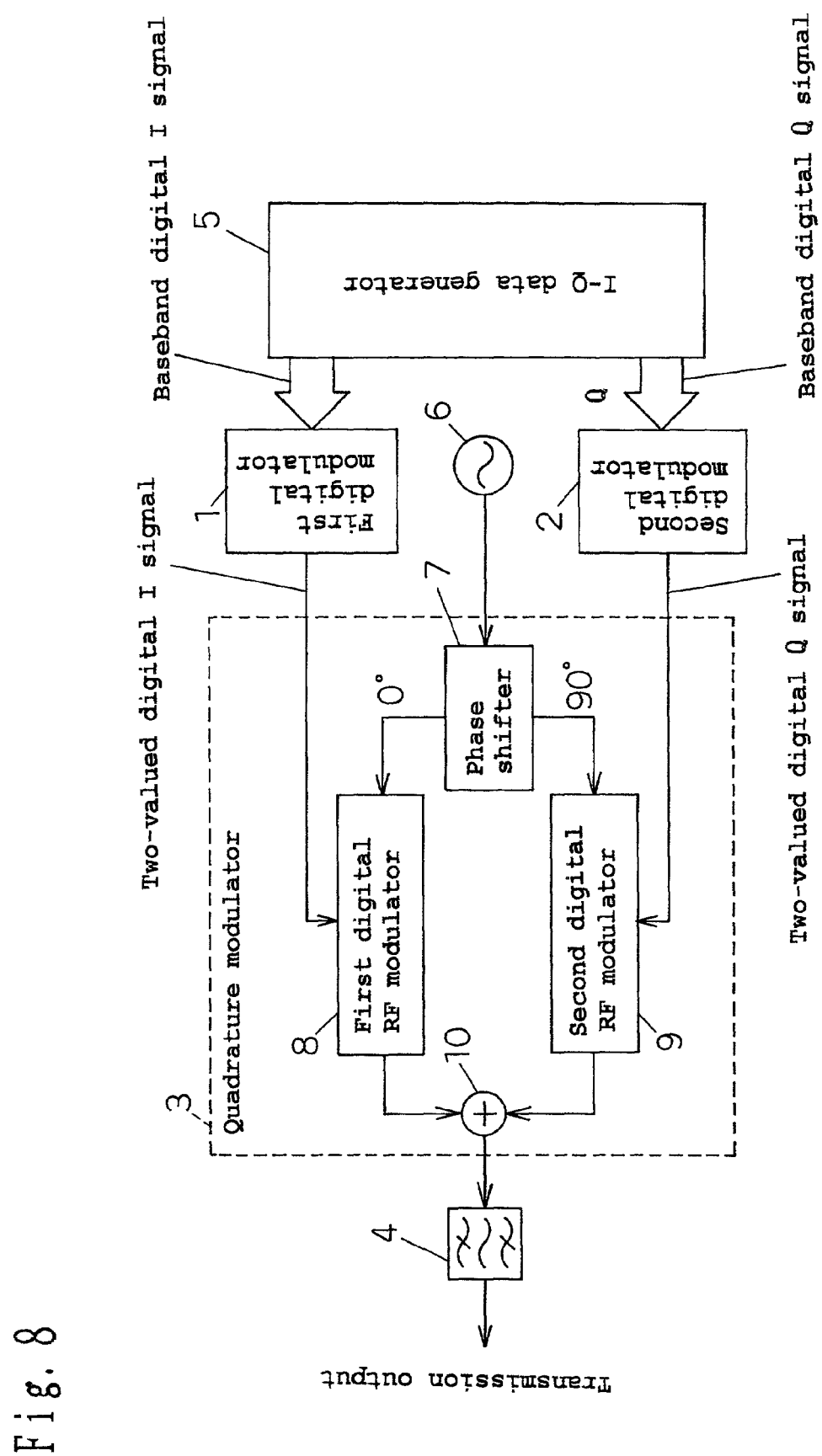
FIG. 8 is a diagram of another example of configuration in accordance with Embodiment 1.

FIG. 8 shows the case that a single band-pass filter 4 is provided in a stage after the synthesis of the output signals of the first digital RF modulator 8 and the second digital RF modulator 9, in place of both the first band-pass filter 110 and the second band-pass filter 111 provided after the respective outputs of the first digital RF modulator 8 and the second digital RF modulator 9 in the configuration of the transmitting circuit apparatus of FIG. 1. The other points of configuration and the operation are identical to those of FIG. 1, and hence description is omitted. The band-pass filter 4 is provided in order to reduce unnecessary signal components occurring in the output signals of the digital RF modulators.

In the present embodiment, the digital modulators are sigma-delta modulators having a configuration shown in FIGS. 3, 5, and 6. However, sigma-delta modulators having any other configuration can obviously result in a similar effect as long as the sigma-delta modulators have a noise shaping effect and generate a digital output signal having the number of bits smaller than that of the baseband I-Q signals.

Further, even a circuit for converting a multi-bit input signal into a two-bit signal by pulse width modulation and the like other than the sigma-delta modulation can obviously result in the effect of realizing a transmitting circuit apparatus having a high efficiency of the amplifier in the quadrature modulator.

Embodiment 2

Figure 9:
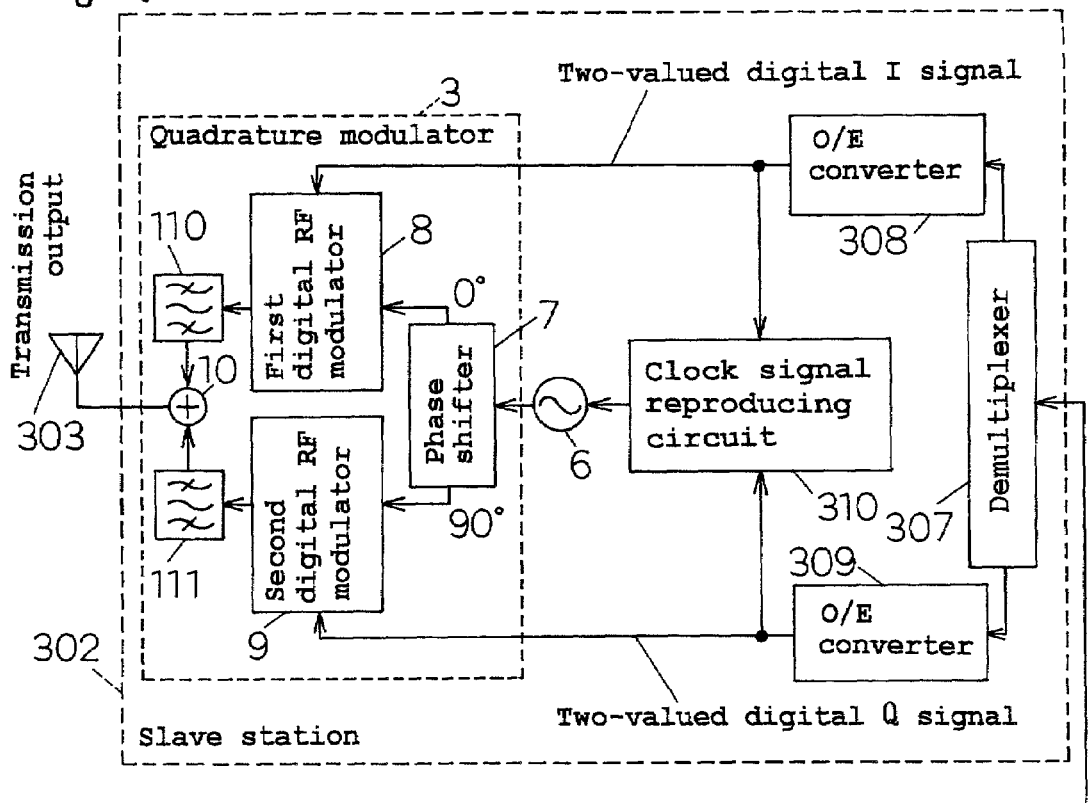
FIG. 9 is a configuration diagram of an example of a transmitting circuit apparatus in accordance with Embodiment 2 of the present invention.
Figure 9:
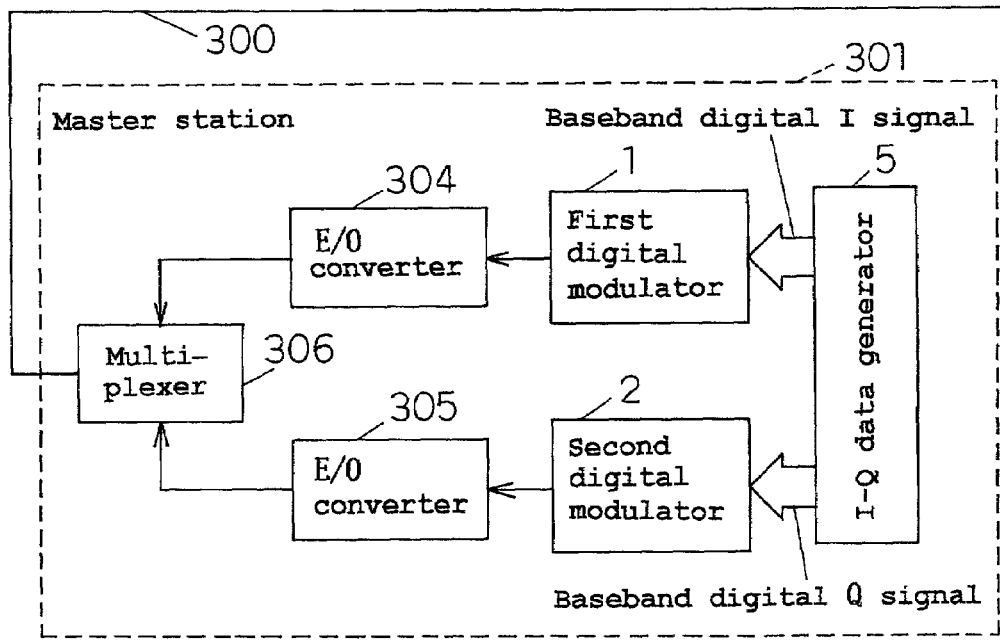

FIG. 9 shows the configuration of a transmitting circuit apparatus in accordance with Embodiment 2 of the present invention. In FIG. 9, a digital modulator and a quadrature modulator are interconnected with an optical fiber in the configuration of the transmitting circuit apparatus of Figure 1. Like numerals are assigned to the like parts to FIG. 1, and the detailed description is omitted. Further, like description to FIGS. 2 to 8 are also omitted.

In FIG. 9, numeral 300 indicates an optical fiber. Numeral 301 indicates a master station. Numeral 302 indicates a slave station. Numeral 303 indicates an antenna. Numerals 304 and 305 indicate E/O converters. Numeral 306 indicates an multiplexer. Numeral 307 indicates an demultiplexer. Numerals 308 and 309 indicate O/E converters. Numeral 310 indicates a clock signal reproducing circuit. The output signals of the digital modulators 1, 2 are converted into optical signals by the E/O converters 304, 305, respectively. Each E/O converter 304, 305 comprises a laser diode which emits light having a wavelength different from each other. The output signals of the E/O converters 304, 305 are mixed by the multiplexer 306, and then output from the master station 301.

The optical signal output from the master station 301 is transferred through the optical fiber 300, and then input to the slave station 302. The optical signal input to the slave station 302 is separated into wavelength components by the demultiplexer 307, thereby being input to the O/E converter 308 or 309. Each O/E converter 308, 309 comprises a photodiode which converts the input optical signal into a digital I signal or digital Q signal which is an electric signal. The clock signal reproducing circuit 310 extracts the clock signal from the digital I and Q signals, thereby outputting the signal to the local oscillator 6. The local oscillator 6 is a PLL oscillator which uses the input clock signal as the reference signal, and outputs a signal which is in phase synchronization with the clock signal and has a frequency equal to the carrier wave frequency. The digital I and Q signals are input to the quadrature modulator 3, thereby modulating the carrier waves in a manner similar to the above-mentioned Embodiment 1. The output signal of the quadrature modulator 3 is output from the antenna 303.

In accordance with the above-mentioned configuration, the data transfer from the master station 301 to the slave station 302 is a digital signal transfer. Accordingly, the frequency band of the optical transfer system can be narrower than that in the analogue transfer of the modulated signal. Further, the allowance for the distortion characteristics in the optical transfer system from the E/O converters 304, 305 to the O/E converters 308, 309 can be set wider. In case that the transfer is carried out after sigma-delta modulation instead of the case of transfer of the baseband digital I and Q signals, the signal processing in the slave station is minimized. Since the frequency of the output signal of the slave station 302 is in synchronization with the clock signal transferred from the master station 301, consideration on the frequency stability of the slave station itself is unnecessary. Further, power consumption of the modulator can be reduced similarly to Embodiment 1. This permits a downsized slave station 302 having a low power consumption. Thus, a downsized optical base station system can be constructed.

Figure 10:
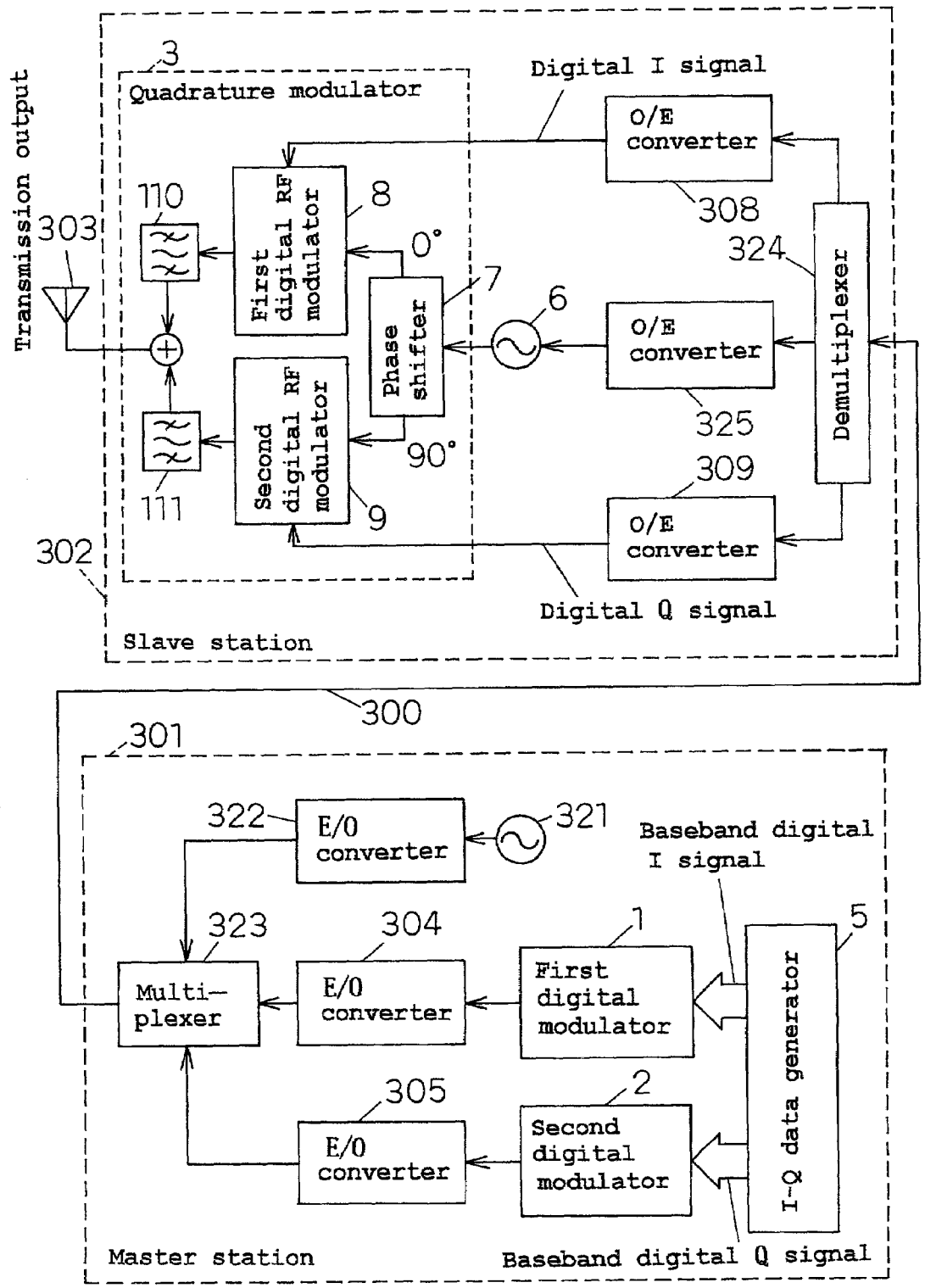
FIG. 10 is a configuration diagram of another example in accordance with Embodiment 2.

FIG. 10 shows another example in which the reference signal for the local oscillator 6 is transferred from the master station 301 to the slave station 302 in a manner different from that of FIG. 9. In FIG. 10, numeral 321 indicates a reference oscillator. Numeral 322 indicates an E/O converter. Numeral 323 indicates an multiplexer. Numeral 324 indicates an demultiplexer Numeral 325 indicates an O/E converter. The output signal of the reference oscillator 321 in the master station is converted to an optical signal by the E/O converter 322. The wavelength of the optical output signal of each E/O converter 304, 305, 322 is different from each other. These signals are mixed by the multiplexer 323, and then transferred from the master station 301 through the optical fiber 300 to the slave station 302. The optical signals each of which has a different wavelength and has been transferred to the slave station 302 are separated into wavelength components by the demultiplexer 324. Each component is input to the O/E converter 308, 309, 325, and converted to an electric signal. The output signals of the O/E converters 308, 309 are input to the quadrature modulator 3 as the digital I and Q signals, respectively. The output signal of the O/E converter 325 is input to the local oscillator 6 as the reference signal. The local oscillator 6 is a PLL oscillator, and outputs a signal which is in phase synchronization with the input reference signal and has a frequency equal to the carrier wave frequency.

In the present configuration, the number of the E/O converters and the O/E converters increases in comparison with the configuration of FIG. 9. However, there is the advantage that a pure and stable signal is available as the reference signal in the slave station 302. The other characteristics and advantages are the same as those of FIG. 9.

In FIG. 10, the local oscillator 6 in the slave station 302 has been assumed to be a PLL oscillator. However, in case that a signal having a frequency equal to the carrier wave frequency or the double the carrier wave frequency is transferred directly from the master station 301, the circuit configuration is much simplified.

Figure 11:
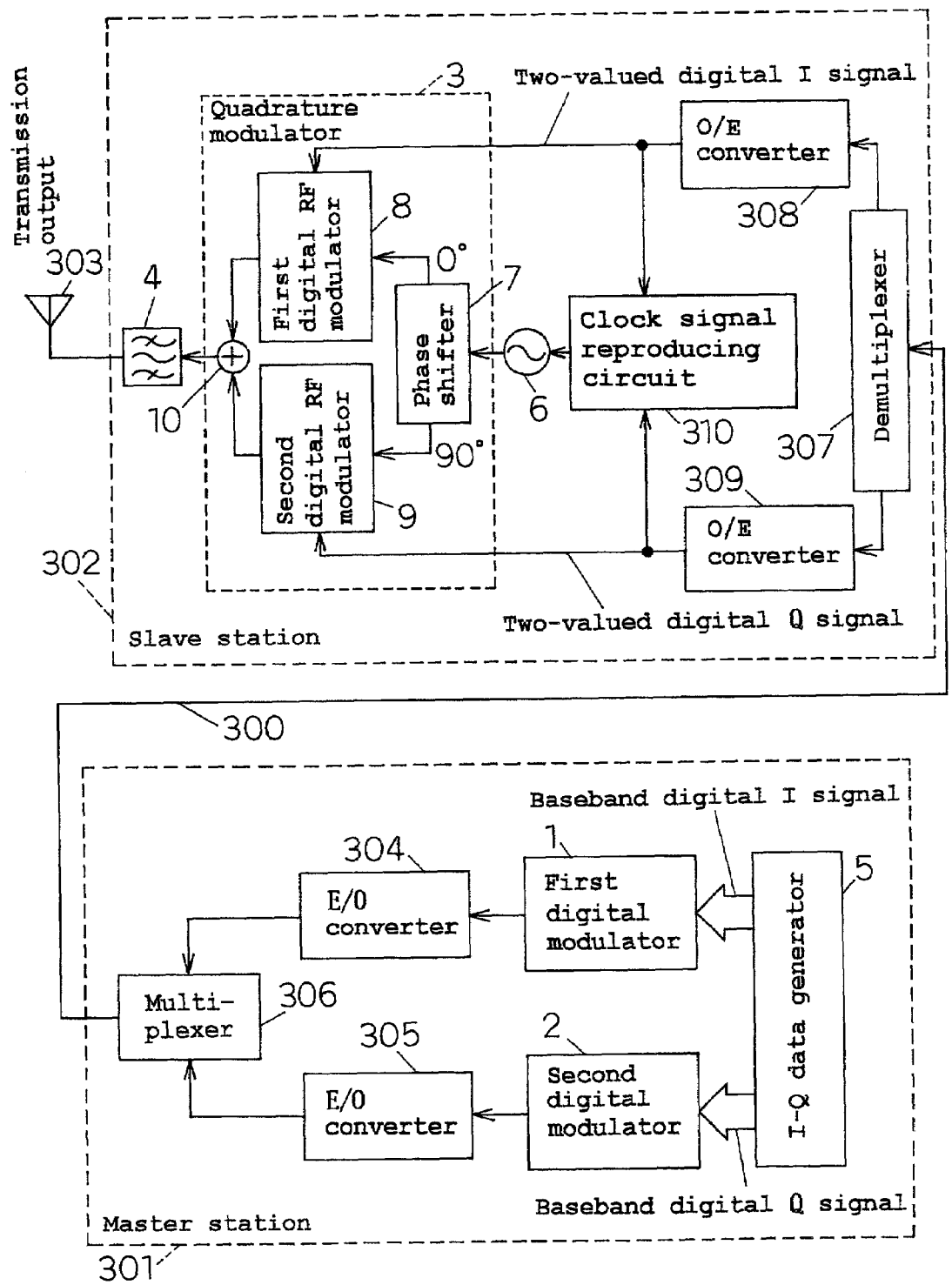
FIG. 11 is a configuration diagram of another example in accordance with Embodiment 2.

In the present embodiment, description has been made for the case that the digital modulator and the quadrature modulator of the transmitting circuit apparatus of FIG. 1 are interconnected through an optical fiber. However, it is also possible that the digital modulator and the quadrature modulator of the transmitting circuit apparatus of FIG. 8 are interconnected through an optical fiber. FIG. 11 shows the configuration of such a transmitting circuit apparatus. Like numerals are assigned to the like parts to FIG. 8, and the detailed description is omitted. Further, like description to FIGS. 2 to 8 are also omitted similarly to the case of FIG. 8. In the transmitting circuit apparatus of FIG. 11, a band-pass filter 4 is provided instead of both the first band-pass filter 110 and the second band-pass filter 111 of the transmitting circuit apparatus of FIG. 9. The other points are the same as those of the transmitting circuit apparatus of FIG. 9.

Figure 12:
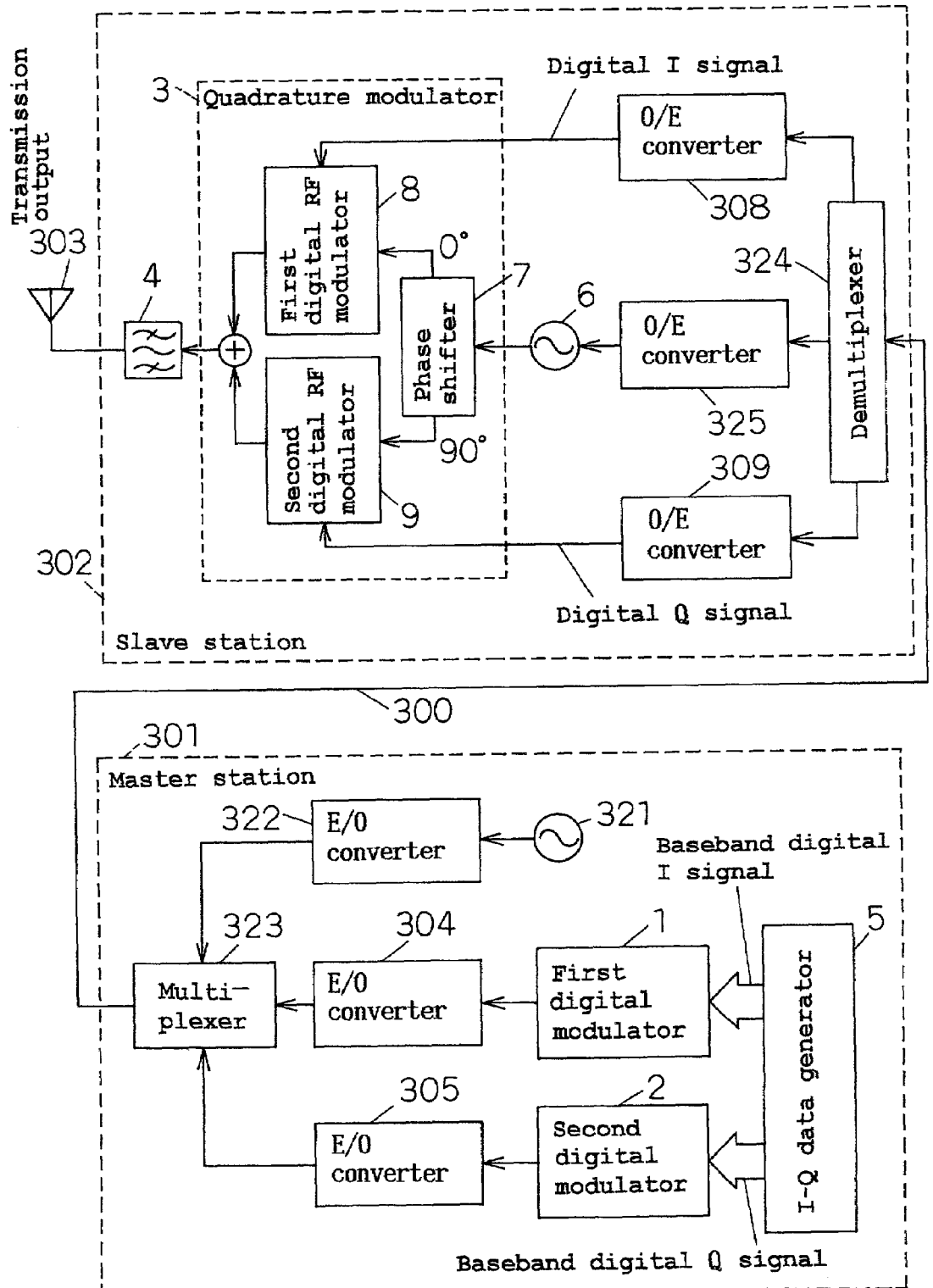
FIG. 12 is a configuration diagram of another example in accordance with Embodiment 2.

FIG. 12 shows another example in which the reference signal for the local oscillator 6 is transferred from the master station 301 to the slave station 302 in a manner different from that of FIG. 11. In the transmitting circuit apparatus of FIG. 12, a band-pass filter 4 is provided instead of both the first band-pass filter 110 and the second band-pass filter 111 of the transmitting circuit apparatus of FIG. 10. The other points are the same as those of the transmitting circuit apparatus of FIG. 10. As such, the transmitting circuit apparatuses shown in FIGS. 11 and 12 also can be used.

As is obvious from the above-mentioned explanation, the present invention has the advantage of realizing a transmitting circuit apparatus having a low power consumption and a good linearity by digitally modulating the baseband I and Q signals into digital signals having a smaller number of bits and by modulating the carrier waves by a quadrature modulator.

What is claimed is:

1. A transmitting circuit apparatus comprising: a first digital modulator and a second digital modulator for performing sigma-delta modulation on an I signal and a Q signal which are multi-valued digital baseband modulation signals, into a digital I signal and a digital Q signal, respectively, having the number of bits smaller than that of said baseband modulation signals, a first E/O converter and a second E/O converter each for converting the output signal of each of said first and second digital modulators into an optical signal having a wavelength different from each other;

a first O/E converter and a second O/E converter each for converting the optical signal transferred from each of said first and second E/O converters into an electric signal; and a quadrature modulator for performing quadrature modulation on a carrier wave by the output signal of each of said first and second O/E converters, as an I signal and a Q signal, respectively.

2. A transmitting circuit apparatus of claim 1, wherein each of said digital I signal and said digital Q signal is a two-valued signal, respectively.

3. A transmitting circuit apparatus of claim 1, wherein said digital I and Q signals converted into optical signals each having a different wavelength are transferred through a common optical fiber.

4. A transmitting circuit apparatus of claim 1, further comprising: a third E/O converter for converting the output signal of a reference signal source into an optical signal having a wavelength different from those of the optical signals of said digital I and Q signals; and a third O/E converter for converting the optical signal transferred from said third E/O converter into an electric signal; wherein said carrier waves are generated from the output signal of said third O/E converter.

5. A transmitting circuit apparatus of claim 1, wherein each of said sigma-delta modulators comprises an n-th-order integrator, a quantizer, and a feedback circuit, wherein a value input to said n-th-order integrator undergoes n-th-order integration and is then input to said quantizer thereby to be quantized into a digital value, wherein said quantized value serves as the output signal of said sigma-delta modulator, and at the same time, is input to said feedback circuit, and wherein the output signal of said feedback circuit is added to the input value of said sigma-delta modulator and the result is input to said n-th-order integrator.

6. A transmitting circuit apparatus of claim 1, wherein each of said sigma-delta modulators comprises a plurality of lower-order sigma-delta modulators connected in multi-stage, wherein the output signal of each of said plurality of lower-order sigma-delta modulators is synthesized by connecting the output to a differentiator having a configuration expressed by a z transform $(1-z^{-1})^m$ with the degree m up to the preceding stage.

* * * * *